United States Patent [19]

Siems

[11] 4,066,971
[45] Jan. 3, 1978

[54] VOLTAGE REGULATOR CIRCUIT FOR AN ELECTRON MICROSCOPE

[76] Inventor: Siemer Siems, 13 Eldwick Court, Potomac, Md. 20854

[21] Appl. No.: 744,865

[22] Filed: Nov. 24, 1976

[51] Int. Cl.² .............................................. H01J 21/00
[52] U.S. Cl. .................................... 328/267; 328/221; 328/270
[58] Field of Search .............. 328/267, 270, 271, 226, 328/221, 190, 222, 258

[56] References Cited

U.S. PATENT DOCUMENTS

| 2,742,568 | 4/1956 | Mansson | 328/222 X |
| 2,801,379 | 7/1957 | Rosenberg | 328/258 X |
| 3,376,491 | 4/1968 | Mas | 328/258 X |

Primary Examiner—John S. Heyman
Attorney, Agent, or Firm—Craig & Antonelli

[57] ABSTRACT

A voltage regulator circuit for an electron microscope incorporates step-down and step-up transformers connected between the filament supply and the filament of a regulator triode. The triode has a cathode separate from the filament, the cathode being connected to the center-tapped primary of the step-up transformer. A magnification-reducing resistor may be connected across the grid and cathode of the triode.

5 Claims, 2 Drawing Figures

VOLTAGE REGULATOR CIRCUIT FOR AN ELECTRON MICROSCOPE

FIELD OF THE INVENTION

The present invention relates to a voltage regulator circuit, particularly a voltage regulator circuit for regulating the high voltage required in an electron microscope.

DESCRIPTION OF THE PRIOR ART

In the operation of present day electron microscopes, of prime importance is the precision and accuracy to which the high voltages employed are regulated. Because of this need prior art regulator circuits have achieved regulation by using an especially designed triode tube which, itself, has become a very expensive item. Since the life of this triode is typically on the order of 5 to 6 years, periodic replacement of the triode has led to a high cost for maintenance of the electron microscope.

FIG. 1 is a schematic illustration of a conventional voltage regulator circuit for an electron microscope in which this especially designed triode is used. The triode 20 has three elements, to wit—a plate 8, grid 9 and cathode filament 10. The plate 8 is connected via conductor 7 to high voltage generator 5, terminals 1 and 2 of which are connected to a 220 volt power source. A very high voltage (on the order of 100,000v) is provided on line 6, which is connected, via feedback resistor 31, to high voltage amplifier 30. Amplifier 30 is also connected via line 16 to the center tapped winding 15 of a step-down transformer 14 and supplies grid control for triode 20 over line 13. The input winding 17 of transformer 14 receives 220 volts at terminals 3 and 4 and provides 1.4 volts to the cathode filament 10. The particular physical and electronic parameters of tubes 20 are such that it is capable of regulating 30,000 volts and has an amplification factor of 1000.

SUMMARY OF THE INVENTION

In accordance with the present invention there is provided a new and improved voltate regulator circuit for an electron microscope which employs commercially available, relatively inexpensive, components, especially with respect to the regulator tube itself, and still achieves the precise and accurate voltage regulation required for proper microscope operation. To this end, the circuit of the present invention incorporates a triode having separate cathode and filament structure, with an additional conversion transformer inserted in the filament supply line. The secondary winding of the conversion transformer supplies 6.3 volts to the triode filament, the separate cathode of which is connected to the center tap of the primary winding of the conversion transformer. A resistor may be inserted across the cathode and grid to reduce the magnification factor. The circuit is capable of regulating the needed high voltage without requiring the use of the very expensive, specially designed, triode tube of the prior art.

DETAILED DESCRIPTION

Figure 1:
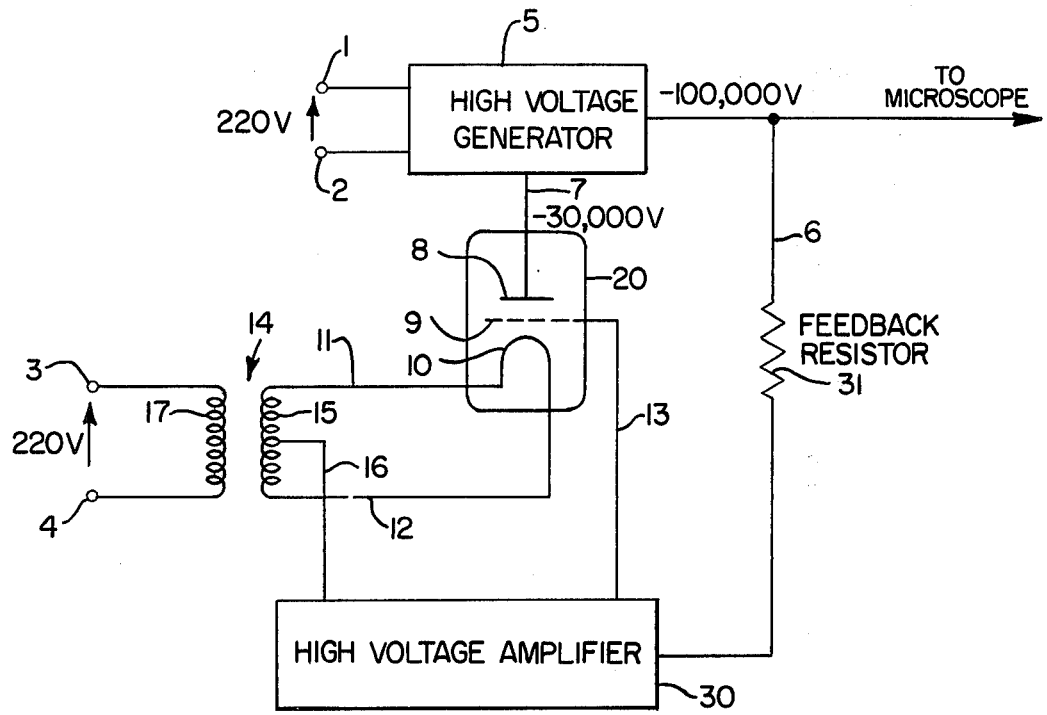
FIG. 1 is a schematic illustration of a conventional voltage regulator circuit for an electron microscope.
Figure 2:
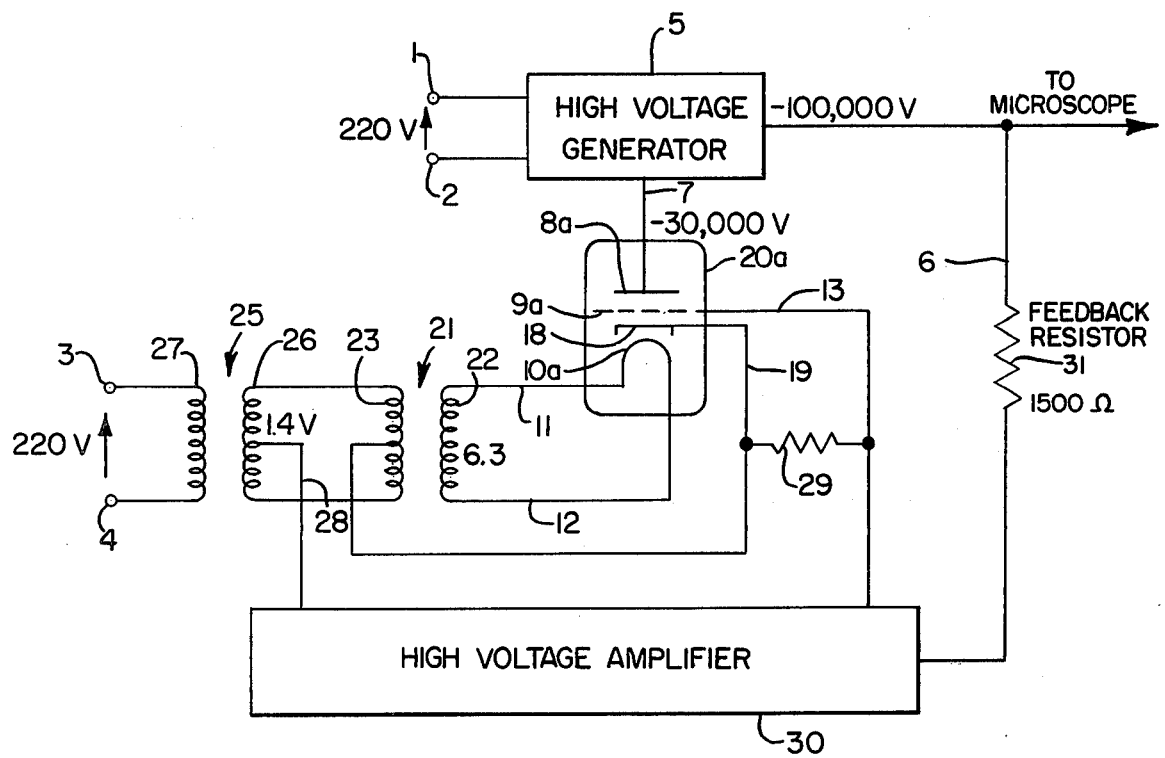
FIG. 2 is a schematic illustration of the voltage regulator circuit according to the present invention.

In FIG. 2, wherein the same reference numerals used in FIG. 1 are employed to denote the same parts of the circuit, the plate 8a of tube 20a is connected via lead 7 to the high voltate generator 5. Tube 20a has a separate filament 10a and cathode 18, as well as a grid 9a. Tube 20a may be a commercially available 6BK4C or 6EL4A tube, for example. The size of these tubes makes it possible to package the circuit of the present invention in a compact manner with an adapter socket making possible direct replacement of the tube circuit of the present invention for the conventional tube package. The grid 9a is connected via lead 13 to high voltage amplifier 30, while the ends of filament 10a are connected through leads 11 and 12, respectively, to the opposite ends of the secondary winding 22 of conversion transformer 21. Winding 22 supplies the necessary 6.3 filament voltage for filament 10a.

The center-tapped primary winding 23 of transformer 21 is connected in parallel with the center-tapped secondary winding 26 of transformer 25. The primary 27 of transformer 25 receives 220 volts at terminals 3 and 4. The tap of winding 26 is connected through lead 28 to amplifier 30, and the tap of winding 23 is connected through lead 19 to cathode 18 of tube 20a. A resistor may be inserted at 29 bridging leads 13 and 19 to reduce the magnification factor.

With the circuit shown in FIG. 2 and using a 6 BK4C for regulator tube 20a, a regulation of 27,000 volts is obtained with an amplification factor of 2000. A significant advantage of the present invention is the simplicity of the circuit together with an extreme reduction in cost of circuit components. The cost of the tube 20a is about 1/130 of the present price of the specially designed triode 20 of the prior art. This provides a significant reduction in maintenance costs and, since the tube is commercially available, ready replacement is possible.

As a modification of the embodiment of the invention shown in FIG. 2, a transistor-regulated D.C. supplying circuit may be inserted in the line connected leads 11 and 12 from winding 22 to filament 10a, to eliminate any ripple voltage produced by the A.C. filament voltage.

While I have shown and described one embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

I claim:

1. In a high voltage regulator circuit, especially one adapted for use in an electron microscope, said circuit having a pair of supply voltage terminals across which a supply voltage is supplied, a voltage regulator tube having a plate electrode adapted to be coupled to a high voltage generator, a grid electrode adapted to be coupled to a high voltage amplifier, and a filament, coupled to said pair of supply voltage terminals, for receiving a filament supply voltage, the improvement wherein
   said tube further includes a cathode separate from said filament, and wherein said circuit further comprises
   a first transformer having a primary winding connected across said pair of supply voltage terminals and a secondary winding, a second transformer having a tapped primary winding, connected in parallel with the secondary winding of said first transformer, and a secondary winding connected across the filament of said tube, and wherein the cathode of said tube is connected to the tapped primary winding of said second transformer.

2. The improvement according to claim 1, wherein the secondary winding of said first transformer has a tap adapted to be coupled to said high voltage amplifier.

3. The improvement according to claim 1, wherein said first transformer is a step-down transformer and said second transformer is a step-up transformer.

4. The improvement according to claim 3, wherein the conversion ratio of said second transformer is less than that of said first transformer.

5. The improvement according to claim 1, further including an impedance connected across the grid and cathode of said voltage regulator tube.

* * * * *